(12) United States Patent
Chang

(10) Patent No.: US 10,404,055 B1
(45) Date of Patent: Sep. 3, 2019

(54) POWER LINE RESISTANCE SENSING DEVICE

(71) Applicant: Alfasemi Inc., Taipei (TW)

(72) Inventor: Yu-Cheng Chang, Cupertino, CA (US)

(73) Assignee: ALFASEMI INC., Taipei (TW)

( * ) Notice: Subject to any disclaimer, the term of this patent is extended or adjusted under 35 U.S.C. 154(b) by 0 days.

(21) Appl. No.: 16/101,737

(22) Filed: Aug. 13, 2018

(51) Int. Cl.
*G01R 27/16* (2006.01)
*H02H 3/32* (2006.01)
*G01R 19/165* (2006.01)
*H05B 33/08* (2006.01)
*H02H 5/12* (2006.01)
*G01R 19/00* (2006.01)

(52) U.S. Cl.
CPC ....... *H02H 3/325* (2013.01); *G01R 19/16504* (2013.01); *H02H 5/12* (2013.01); *H05B 33/089* (2013.01); *G01R 19/0038* (2013.01); *G01R 19/16552* (2013.01)

(58) Field of Classification Search
CPC ........ H02H 3/325; H02H 5/12; H05B 33/089; G01R 19/0038; G01R 19/16504; G01R 19/16552; G01R 27/08; G01R 27/16; G01R 27/20; G01R 27/22; F21V 25/00; F21V 25/02; F21V 23/0457
See application file for complete search history.

(56) References Cited

U.S. PATENT DOCUMENTS

2007/0008665 A1* 1/2007 Moyer ..................... H02H 3/05
361/42
2015/0263510 A1* 9/2015 Yang .................. H05B 33/0887
315/119
2017/0311396 A1* 10/2017 Sadwick ................. F21V 25/00

* cited by examiner

*Primary Examiner* — Wei (Victor) Chan
*Assistant Examiner* — Henry Luong
(74) *Attorney, Agent, or Firm* — Bacon & Thomas, PLLC

(57) ABSTRACT

A power line resistance sensing device adapted to a lamp system with an LED module connected to a power supply between a supply line and a ground line. The power line resistance sensing device includes a control unit including a first pin connected to an LED switch to turn on or turn off the LED module; a second pin connected to a testing switch to fire a testing current from a testing current source into the lamp system before a full conduction of the lamp system; and a third pin used to receive a voltage drop induced by the testing current fired in the lamp system. The control unit is configured to compare the voltage drop with a predetermined safety voltage drop, thereby controlling the LED switch.

17 Claims, 9 Drawing Sheets

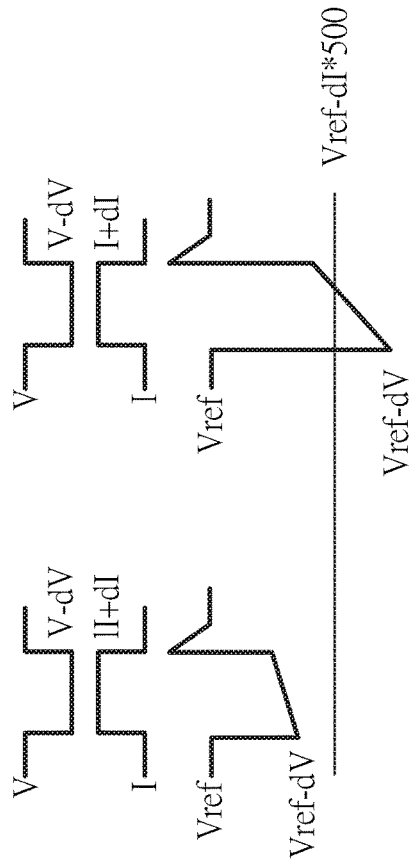
FIG. 9  First type timing
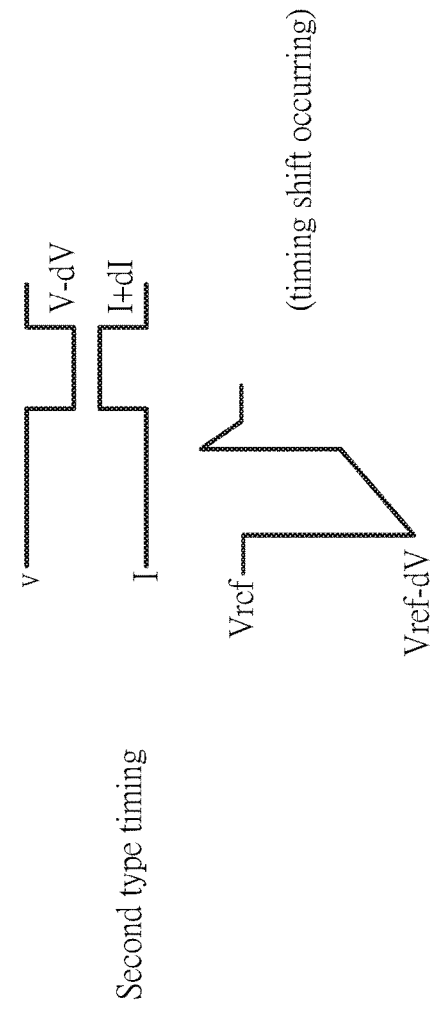
FIG. 10  Second type timing

POWER LINE RESISTANCE SENSING DEVICE

BACKGROUND OF THE INVENTION

1. Field of the Invention

The present invention relates to a power line resistance sensing device and, more particularly, to a power line resistance sensing device in a lamp system.

2. Description of Related Art (Background Information)

All circuits have at least two power buses (power lines), one supply and one ground. More complex circuits may have more than two power buses. The supply buses are usually labeled as "vdd", "vdda", "vddd", "vddp", "vcc", and so on. The ground buses are usually labeled as "gnd", "gnda", "gndd", "gndp", vss, and so on.

Typical circuits do not sense or detect a resistance between power buses. However, some circuits may sense a supply voltage to see whether the supply voltage reaches an operation range for the circuits. If the supply voltage stays in a suitable range, the circuits can start to work. If the supply voltage is out of the suitable range, either too high or too low, the circuits can refuse to work or activate some protections. Some mechanisms, such as undervoltage-lockout (UVLO) or brownout detections are used to sense the supply voltage ranges.

Besides, some circuits may sense or detect loads to see if the loads are out of a suitable range. Again, if the loads are out of the suitable range, corresponding safety protections may be in play. For example, short protection, over-current protection, and over-voltage protection are used to sense the loads, in order to protect the circuits.

However, the present invention is different from the aforementioned two types of detections.

(Current Situation)

As mentioned previously, the typical circuits may sense either the supply voltage or the loads to see whether they are within suitable ranges. Otherwise, the corresponding protections may be in play. Generally speaking, in these cases, the protections are activated after the circuits start their normal working.

Fluorescent lamps and LED lamps have different threshold voltages. A fluorescent lamp usually has a threshold voltage up to couples of hundred voltages, but an LED lamp usually has a lower threshold voltage from 20V to 100V. The threshold voltage varies by the tube length, diameter, material, temperature or aging. When the supply voltage applied to a lamp is lower than the threshold voltage, the lamp cannot work. Only when the supply voltage applied to the lamp is higher than the threshold voltage, and lasts long enough, the lamp can start to work.

These applications raise some safety concerns under special environments. First, the fluorescent lamp striking voltages are high enough to incur human electrical shocks. Second, a user who tries to insert a lamp tube into a socket with a living supply may be injured by an electrical shock if he holds one end of the lamp tube with his barefoot on ground.

A very low supply voltage may still be insulated from a human body, or the human body may not form a completed electrical loop. In this case, the user can be free from the electrical shock, but the lamp cannot be ignited. In contrast, the user may be injured by the electrical shock from the supply voltage that is high enough to pass the threshold to ignite the lamp if there is no proper protection. However, the prior art circuits are designed to ignite the lamp at first, then detect an abnormal situation later, and shut down the lamp if the abnormal situation is detected. Because the protection is activated later than the ignition, the user may be shocked in the very beginning, and it is too late to activate the protection. In short, the prior art circuits cannot effectively protect the user from the electrical shock.

Therefore, it is desirable to provide an improved power line resistance sensing device to mitigate and/or obviate the aforementioned problems.

SUMMARY OF THE INVENTION

The present invention aims to provide a the power line resistance sensing device in a lamp system (preferably an LED tube) to sense the resistance R between the power lines before the LED tube becomes conductive, and thus the user can be protected from the electrical shock effectively.

According to one aspect, the present invention provides a power line resistance sensing device adapted to a lamp system with an LED module connected to a power supply between a supply line and a ground line. The power line resistance sensing device includes a control unit including a first pin connected to an LED switch to turn on or turn off the LED module; a second pin connected to a testing switch to fire a testing current from a testing current source into the lamp system before a full conduction of the lamp system; and a third pin used to receive a voltage drop induced by the testing current fired in the lamp system. The control unit is configured to compare the voltage drop with a predetermined safety voltage drop, thereby controlling the LED switch.

Particularly, the power line resistance sensing device further includes a first capacitor arranged between the supply line and the third pin. The power line resistance sensing device further includes a first resistor and a second resistor connected to the third pin. The first resistor and the second resistor form a voltage divider to provide a normal reference voltage. A reference voltage of the third pin recovers by the normal reference voltage after a resistance sensing is completed.

With the first resistor and the second resistor forming a voltage divider, the voltage of the third pin is Vref=supply×R1/(R1+R2). The first capacitor serves as a high-pass filter. Before the testing current dI is injected from the testing current source into the system, the supply remains relatively stable. After the control unit injects dI to the supply line, dI will generate a relatively high frequency signal dV on the supply. dV will be sent to the third pin through the first capacitor, the high-pass filter, and a voltage Vref−dV will appear at the third pin at this moment. When the control unit turns off the testing current source, and dI is not injected any more, the total current will be reduced by dI, and the supply will be increased by dV.

Particularly, the control unit further includes a comparing circuit and a control circuit; the control circuit is configured to control the LED switch and the testing switch based on a comparison result given by the comparing circuit. The comparing circuit includes a comparator, a calculator, a second capacitor, and sample-hold switch; the comparator has a first input end connected to a sample-hold node, and a second input end connected to an output end of the calculator; an input end of the calculator is connected to the second capacitor and one end of the sample-hold switch; another end of the sample-hold switch is connected to the sample-hold node. The first resistor, the second resistor, and the first capacitor are connected to the sample-hold node. The third pin serves as the sample-hold node.

Particularly, the safety voltage drop is predetermined by the testing current multiplied by a safety resistance, and the safety resistance is less than 500 ohm for preventing an electrical shock on a human body, and has another suitable range in another application.

The detection of the resistance aims to confirm a correct supply-lamp-ground connection. Normally, the resistance between the supply line and the ground line should be low to reduce the power loss and enhance the efficiency. Any high resistance between supply and ground is deemed abnormal. If the voltage drop created by the testing current is higher than a predetermined voltage, it means that the resistance between the supply line and the ground line is beyond expectation, and that the connection is incorrect. One of the possibilities causing the incorrect connection is a human body in the loop.

Particularly, the LED switch is initially open-circuited, and the power line resistance sensing device keeps the LED switch open-circuited if the voltage drop is greater than the safety voltage drop.

According to another aspect, the present invention provides a power line resistance sensing device adapted to a lamp system with an LED module connected to a power supply between a supply line and a ground line. The power line resistance sensing device includes a control unit including a first pin connected to an LED switch to turn on or turn off the LED module; a second pin connected to a testing switch to fire a testing current from a testing current source into the lamp system before a full conduction of the lamp system; a third pin used to receive a voltage drop induced by the testing current fired in the lamp system; and a fourth pin used to determine a suitable timing for firing the testing current. The control unit is configured to compare the voltage drop with a predetermined safety voltage drop, thereby controlling the LED switch.

Particularly, the power line resistance sensing device further includes a first capacitor arranged between the supply line and the fourth pin. The power line resistance sensing device further includes a first resistor and a second resistor connected to the third pin; and an internal buffer providing a normal reference voltage to the first capacitor. The normal reference voltage is set independent of the first resistor, the second resistor, and the power supply. A reference voltage of the fourth pin recovers by the internal buffer after a resistance sensing is completed.

The supply may be supply mains or other types of voltages. If it is supply mains, appearing a sine wave, the supply may be zero or a significant low voltage. The voltage divider formed by the first resistor and the second resistor is used to determine the voltage of the supply, and it is an optional component. If the supply approaches zero, Vref–dV will stay in an unsuitable voltage range, and give a comparing circuit a hard time to make a correct decision.

Particularly, the control unit further includes a comparing circuit and a control circuit; the control circuit is configured to control the LED switch and the testing switch based on a comparison result given by the comparing circuit. The comparing circuit includes a comparator, a calculator, the internal buffer, and a sample-hold switch; the comparator has a first input end connected to a sample-hold node, and a second input end connected to an output end of the calculator, the internal buffer has a first input end, a second input end, and an output end, the first input end of the internal buffer is connected to the normal reference voltage, the second input end and the output end of the internal buffer are connected to each other and further connected to one end of the sample-hold switch; and another end of the sample-hold switch is connected to the sample-hold node; and the first capacitor is connected to the sample-hold node. The fourth pin serves as the sample-hold node.

Particularly, the power line resistance sensing device performs a synchronization check of the voltage drop and the testing current.

If the timing shift is detected, it means that the supply possibly works under a supply type other than supply mains, because the supply mains frequency is 50 Hz or 60 Hz, relatively lower than the operation frequency of the present invention. If the supply changes too fast, or dV keeps out of synchronization with dI, the supply may probably be a ballast. According to the present safety standard, the ballast already has a protection mechanism, while, an LED lamp has to be equipped with an individual protection mechanism under the supply mains.

The other way to detect supply types is to count the supply change rates. If the supply is mains, the change rate will be about 50 Hz or 60 Hz. If the supply change rate is consistently much higher than 50 Hz or 60 Hz, for example, the supply change rate keeps at 1 KHz, much higher than 50 Hz or 60 Hz, it means the supply is ballast.

Particularly, the safety voltage drop is predetermined by the testing current multiplied by a safety resistance, and the safety resistance is less than 500 ohm for preventing an electrical shock on a human body, and has another suitable range in another application.

Particularly, the LED switch is initially open-circuited, and the power line resistance sensing device keeps the LED switch open-circuited if the voltage drop is greater than the safety voltage drop.

It is to be understood that "sensing the resistance R between the power lines" may be implemented by a calculation or a comparison with respect to voltage, current, or both of them relevant to the resistance R according to present invention Other objects, advantages, and novel features of the invention will become more apparent from the following detailed description when taken in conjunction with the accompanying drawings.

BRIEF DESCRIPTION OF THE DRAWINGS

FIG. 9 shows a timing diagram of first type timing according to the present invention; and FIG. 10 shows a timing diagram of second type timing according to the present invention.

DETAILED DESCRIPTION OF THE PREFERRED EMBODIMENT

Different embodiments of the present invention are provided in the following detailed description. These embodiments are not meant to limiting. It is possible to make modifications, replacements, combinations, separations or designs with the features of the present invention to apply to other embodiments.

(Invention Work Concept)

In order to prevent electrical shocks, a special detection is done before conducting a full power from a power source (power supply) to a lamp, or applying a high voltage on the lamp. The present invention provides a power line resistance sensing device in parallel with the lamp to detect a loop impedance before the lamp is turned on. The power line resistance sensing device of the present invention is not designed to detect either a supply voltage or a load resistance, but it is designed to detect the loop impedance, in particular, a resistance between power lines (a supply bus and a ground bus). The loop impedance that is low enough means a correct electrical loop, and in this case, the power line resistance sensing device of the present invention will allow the full power to pass the lamp. Otherwise, it will remain the lamp turned off, and will not deliver a high voltage or a high power, or keep looping on resistance sensing until the high impedance situation is removed.

Figure 1:
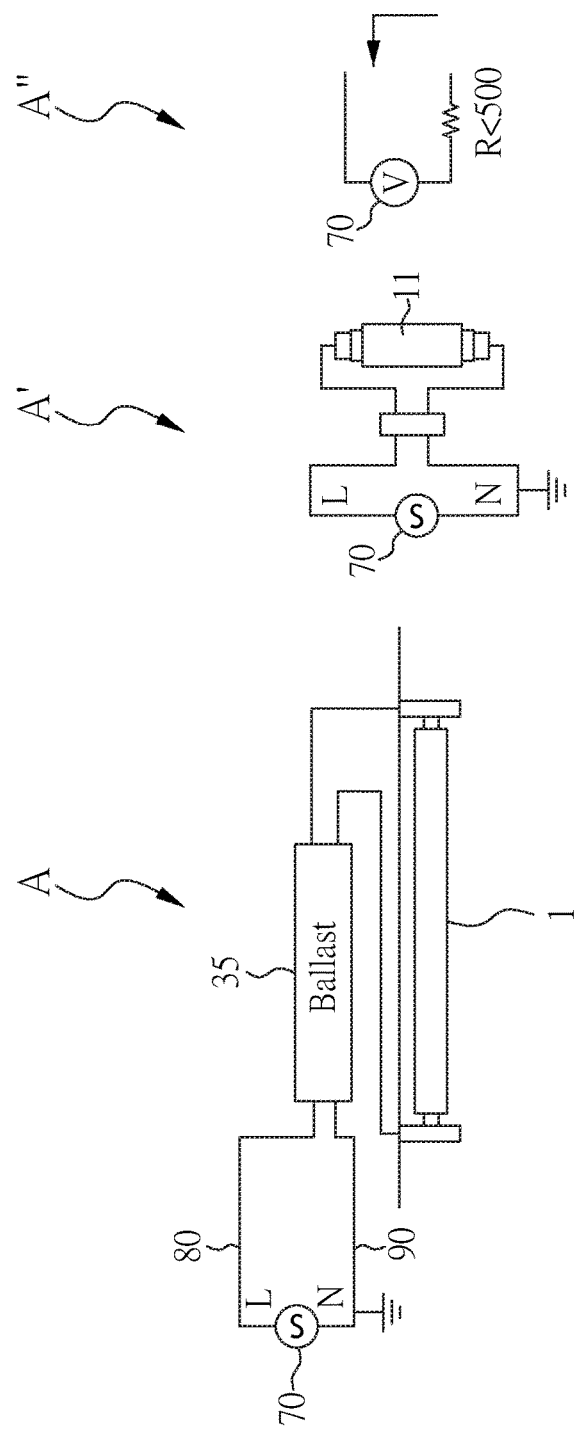
FIG. 1 shows a normal electrical loop illustrated by the lamp system A, its equivalent circuit A', and its simplified circuit A"

FIG. 1 shows a normal electrical loop illustrated by the lamp system A, its equivalent circuit A', and its simplified circuit A" for observing the loop impedance (the resistance R), which should be smaller than 500 ohm.

Figure 2:
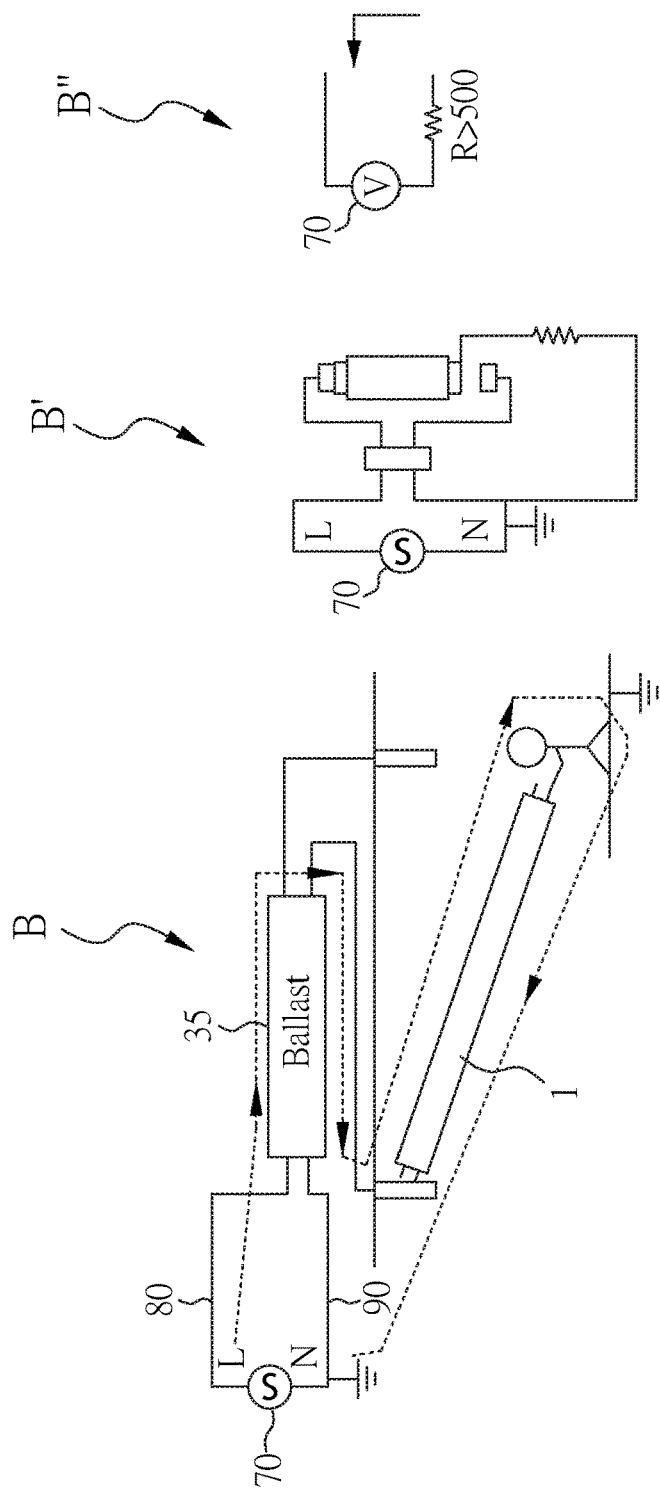
FIG. 2 shows an abnormal electrical loop illustrated by the lamp system B, its equivalent circuit B', and its simplified circuit B"

FIG. 2 shows an abnormal electrical loop illustrated by the lamp system B, its equivalent circuit B', and its simplified circuit B" for observing the loop impedance (the resistance R). The abnormal electrical loop occurs because a user tries to insert the lamp system (the lamp tube) 1 into the socket (not labeled), and his human body is in the electrical loop. The user may be shocked when a current flows through his body. From an electrical point of view, the human body may be represented by the 500 ohm resistance R.

In a normal situation, the resistance R between power lines (a supply line 80 and a ground line 90) should be low. Otherwise, a huge power loss may happen at the side of the supply line 80. It is based on an electrical design about how low the resistance R should be. However, a normal design will not allow a high impedance existing between the power lines 80 and 90. The electrical design should avoid a (full) conduction with a high resistance R between the power lines 80 and 90, in order to reduce the conduction loss. A high resistance R detected between the power lines 80 and 90 means an abnormal electrical loop. Under such an environment, the power line resistance sensing device 10 of the present invention will initially forbid a huge current through the LED module 30.

Figure 3:
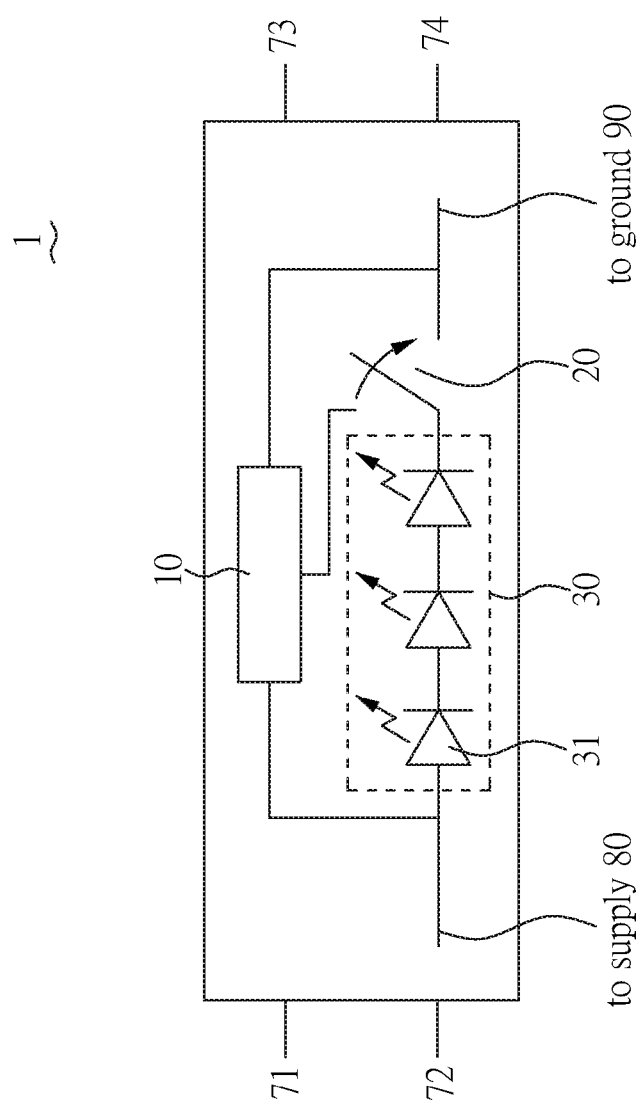
FIG. 3 shows the lamp system according to the present invention.

FIG. 3 shows the lamp system 1 according to the present invention.

The power line resistance sensing device 10 of the present invention is in parallel with an LED module 30 (the LED module) and controls an LED switch 20 to allow a current flow through the LED module 30. The power line resistance sensing device 10 works first to sense or detect the resistance between the power lines (the supply line 80 and the ground line 90). The power line resistance sensing device 10 delivers only a tiny power which does not hurt the user during working. In FIG. 3, there are two pins on each side, totally 4 pins, 71, 72, 73, 74. It does not necessarily mean that the left-handed side is the supply line 80 and right-handed side is the ground line 90. The LED module 30 may be configured with supply/ground on the same side or on different sides, by different pin connections. Accordingly, the power line resistance sensing device 10 may be configured to sense one-sided or two-sided supply/ground resistance.

Figure 4:
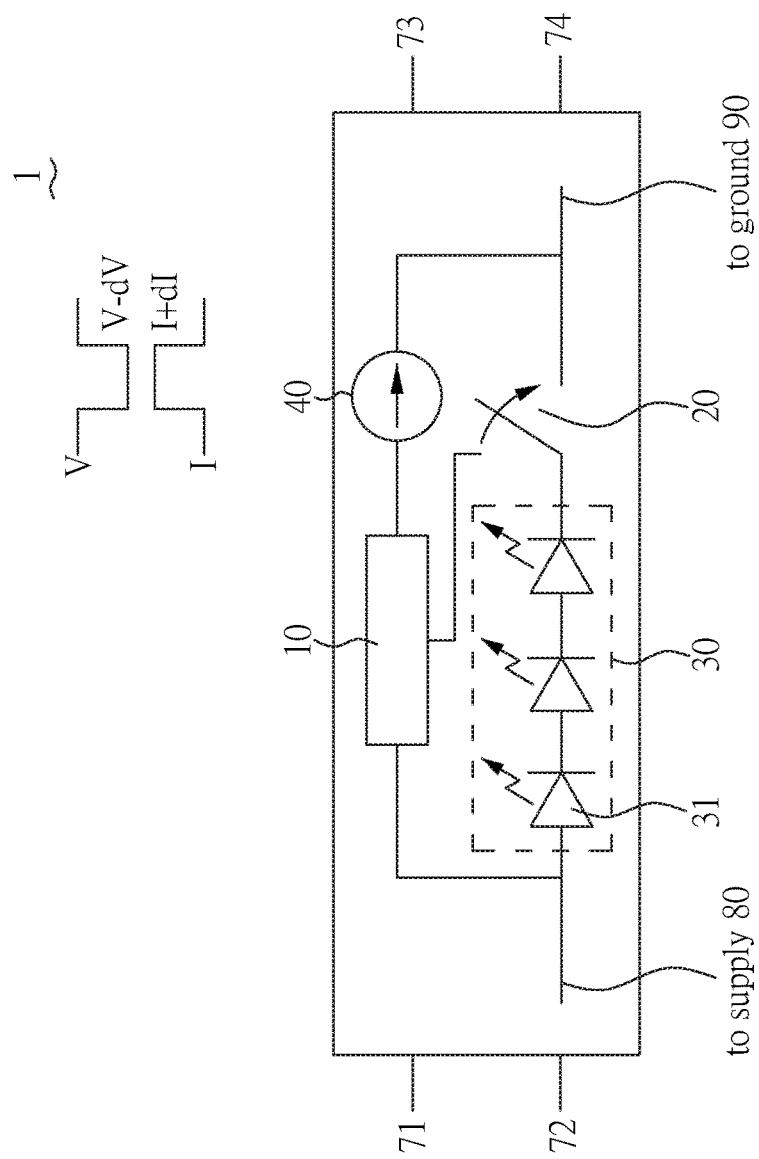
FIG. 4 shows the lamp system according to the present invention firing a testing current.

FIG. 4 shows the lamp system 1 according to the present invention firing a testing current.

When the power line resistance sensing device 10 works, it consumes a tiny current (power) which does not hurt the human body. At an initial time, the lamp system 1 consumes a current with a value I, and the supply line 80 supplies a voltage with a value V. At a sensing time, the power line resistance sensing device 10 increases current from I to I+dI, and thus the voltage of the supply line 80 changes from V to V-dV accordingly. The resistance R between the supply line 80 and the ground line 90 can be calculated by dV divided by dI (e.g. dV/dI) according to Ohm's law. In the normal situation, the resistance R should be low. Once the power line resistance sensing device 10 confirms the resistance R is lower than a pre-defined value (for example, 500 ohm), which means that the lamp system 1 is in a good shape, the power line resistance sensing device 10 will turn on the LED switch 20 to allow the current flowing through the LED module 30. If a calculated result shows that resistance R is too high (for example, higher than 500 ohm), which means that the lamp system 1 may have a wrong connection, the power line resistance sensing device 10 will prevent the lamp system 1 from working in full power, in order to prevent any further damages.

(Invention Work Under Various Supply Types)

The LED module 30 may work under various supply types. An LED lamp can work under not only AC supplies of 90V, 120V, or 220 v, at 50 Hz or 60 Hz, but also ballasts with high frequencies. The invention will detect the supply line 80 types, either AC sources or ballasts. The invention responses differently if the LED lamps are under AC sources or ballasts. Under an AC source supplies, the present invention will detect the supply/ground resistance R and allow a huge current flowing through the LED module 30 only if the resistance R is lower than 500 ohm. Alternatively, once the present invention detects a supply varies at higher rate, the supply may be a ballast. Under a ballast supply, the present invention will turn on the LED switch 20 to allow a current going through the LED module 30 immediately, no matter what the resistance R is.

First Embodiment

Figure 5:
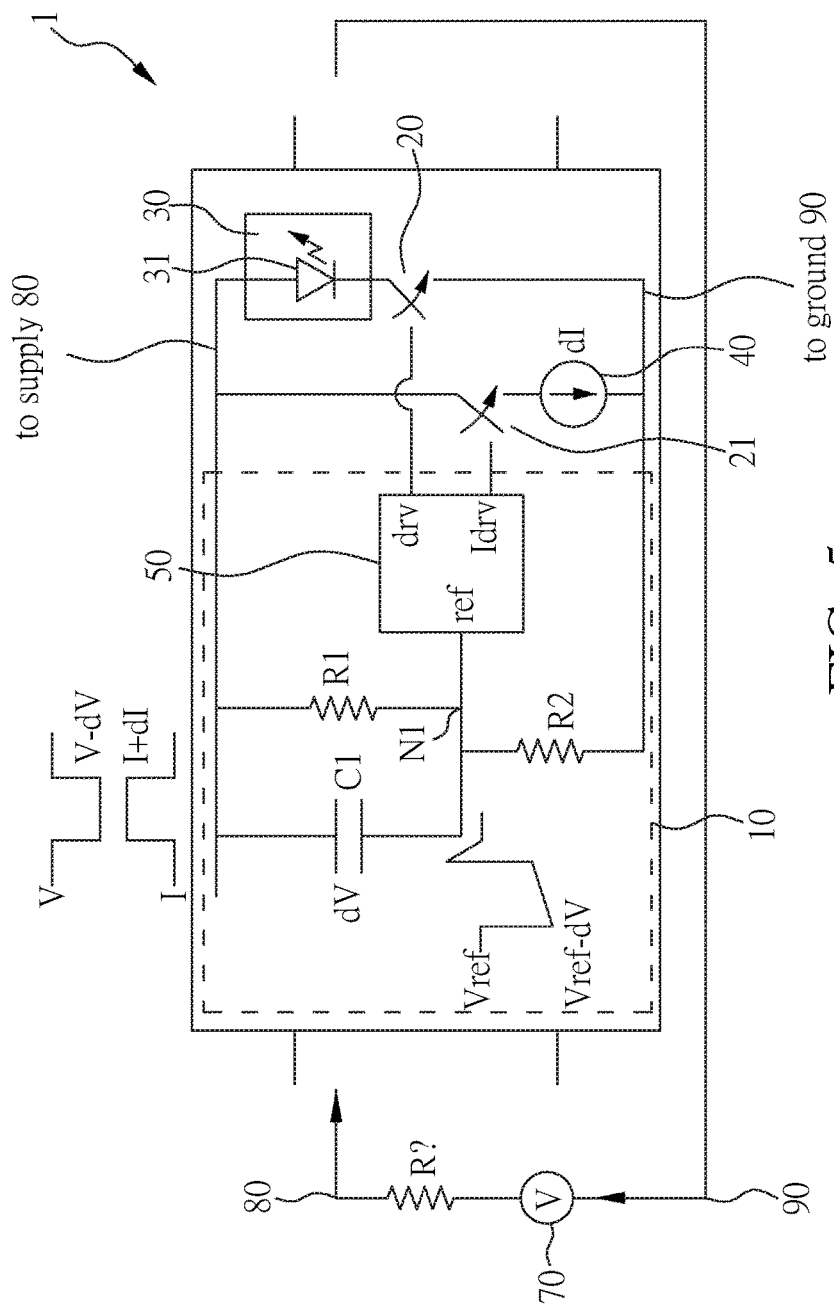
FIG. 5 shows a detailed circuit diagram of the lamp system according to the first embodiment of the present invention.

FIG. 5 shows a detailed circuit diagram of the lamp system 1 according to the first embodiment of the present invention.

The lamp system 1 includes a power line resistance sensing device 10, an LED switch 20, a testing switch 21, an LED module 30, a testing current source 40, and a power supply 70.

The LED module 30 is connected to the power supply 70 between power lines (a supply line 80 and a ground line 90) through the LED switch 20. The LED module 30 includes a plurality of LEDs 31 for lighting.

The power line resistance sensing device 10 includes a control unit 50, a first resistor R1, a second resistor R2, and a first capacitor C1. The control unit 50 has three pins: dry (first pin), Idrv (second pin), and ref (third pin). The pin dry is connected to and controls the LED switch 20 to turn on/off the LED module 30. The pin Idrv is connected to and controls the testing switch 21 to fire (inject) a testing current dI from the testing current source 40. The pin ref is used to receive the ratio of supply voltage to determine a suitable timing for firing the testing current dI and calculate the resistance R.

The power supply 70 may be an AC source providing a sinusoid supply voltage, which may drop to zero periodically. However, when the sinusoid supply voltage is close to zero, it is difficult to detect a voltage drop dV, V−dV may be a negative value, and thus the resistance R may be calculated incorrectly. Therefore, the power line resistance sensing device 10 is designed to detect whether the supply voltage is close to zero by comparing the supply voltage with a standard value through the pin ref, and not to fire the testing current dI if the supply voltage approaches zero.

The first capacitor C1 is arranged between the supply line 80 and the pin ref. The first capacitor C1 is used to receive the voltage drop dV when the supply voltage of the power supply 70 drops from V to V−dV abruptly. Once the testing current dI induces the voltage drop dV on the supply voltage, the voltage drop dV will also show up on the pin ref through the first capacitor C1.

The first resistor R1 and the second resistor R2 form a voltage divider to provide a ratio voltage of the supply voltage to be a normal reference voltage Vref.

When the testing current dI is injected into the lamp system 1, it will induce a sharp voltage drop dV. By the first capacitor C1, the voltage drop dV is transferred to the pin ref. For example, while the supply voltage is 120V instantly, the testing current dI is fired and causes a 400 mV drop on the supply voltage, which thus becomes 119.6V. With R1:R2=100:1 and C1, the voltage of the pin ref changes from 1.2V to 0.8V accordingly. If the predetermined safety voltage drop is 500 mV, the lamp system 1 will be determined in a good shape because 400 mV<500 mV.

Figure 6:
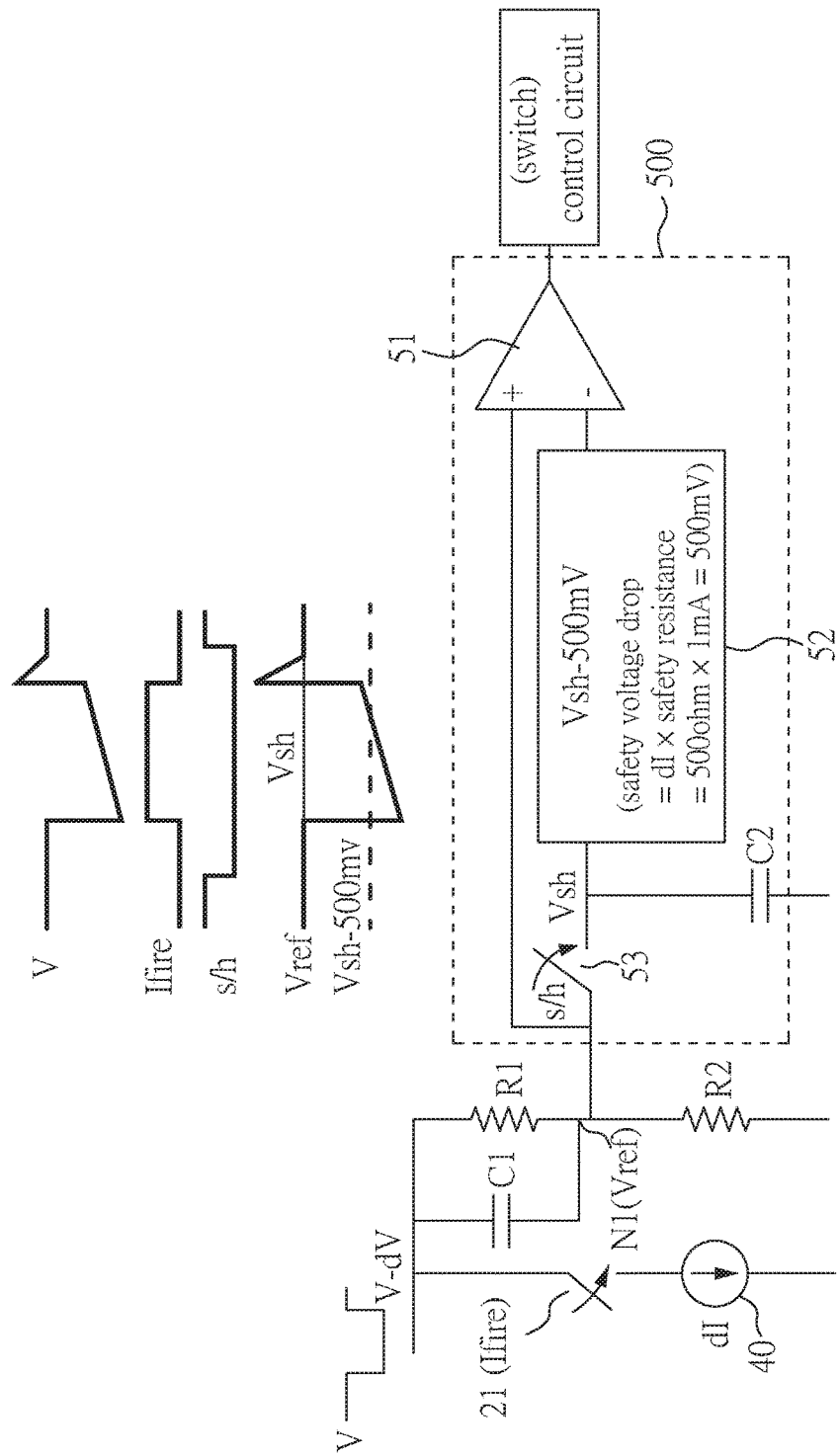
FIG. 6 shows further detailed timing diagram and circuit diagram of FIG. 5.

FIG. 6 shows further detailed timing diagram and circuit diagram of FIG. 5.

Here are more detailed steps explaining the sensing mechanism of the present invention, with reference to FIGS. 5 and 6:

(1) Sampling and holding Vref=1.2V into the second capacitor C2 in FIG. 6;

(2) Calculating Vsh−500 mV=1.2V−500 mV=700 mv;

(3) Firing dI into the system 1 between the supply line 80 and the ground line 90, and thus supply voltage=V−dV, and accordingly Vref=1.2V−dV. As previously discussed, dI generates dV=400 mV, supply voltage=120V−0.4V=119.6V, and Vref=−0.2V−0.4V=0.8V;

(4) Comparing Vref=0.8V with Vsh−500 mV=0.7V. In this case, we will find that Vref is higher, which further means that the resistance R between the supply line 80 and the ground line 90 is less than expectation, so the LED switch 20 can be turned on;

(5) Otherwise, if dI causes dV=600 mV, Vref=1.2−0.6=0.6, which is lower than Vsh−500 mV=0.7V. In this case, the LED switch 20 should not be turned on.

If dV≥dI×500, it means that the resistance R between the supply line 80 and the ground line 90 is higher than a normal condition, wherein the multiplier 500 is given because R>500 indicates an abnormal condition, and the multiplier may be other suitable values in different applications. In this case, the power line resistance sensing device 10 will not allow the current flowing through the LED module 30 by keeping the LED switch 20 open-circuited.

It can be appreciated that the protection of the present invention is activated before the LED module 30 becomes conductive, and thus the user can be protected effectively.

The control unit 50 in FIG. 5 includes a comparing circuit 500 and a (switch) control circuit (not labeled by a reference numeral). The control circuit is designed to control the LED switch 20 in FIG. 5 and the testing switch 21 based on a comparison result given by the comparing circuit 500. The control circuit may be implemented by any suitable circuit, and the detailed description is omitted here.

The comparing circuit 500 includes a comparator 51, a calculator 52, a second capacitor C2, and sample-hold switch 53.

There is a sample-hold node N1 to which the first resistor R1, the second resistor R2, and the first capacitor C1 are connected. The comparator 51 has a positive (first) input end (+) connected to the sample-hold node, and a negative (second) input end (−) connected to an output end of the calculator 52. An input end of the calculator 52 is connected to the second capacitor C2 and one end of the sample-hold switch 53. Another end of the sample-hold switch 53 is connected to the sample-hold node N1.

In order to explain the operation of the circuit, some pre-defined values are provided here only for example but not meant to limiting. The testing current dI=1 mA. The safety resistance=500 ohm, and accordingly, the safety voltage drop=dI×500 ohm=500 mV. The sample and hold signal s/h=LOW means tristate. The testing signal Ifire=HIGH means 1 mA dI injected. The Ifire and the s/h are none-overlapped to keep noise free.

Before the testing current dI is fired (injected), the sample-hold signal s/h turns from HIGH to LOW to make the sample-hold switch 53 open-circuited and thus keeps (samples and holds) the normal reference voltage Vref into a sampled voltage Vsh. The calculator 52 will then calculate a basic value Vsh−500 mV, wherein 500 mV is the safety voltage drop. The basic value Vsh−500 mv will be a comparison basic inputted to the negative input end of the comparator 51.

After a dead-time, the testing current dI is fired (injected), and the voltage drop dV occurs on the supply voltage of the power supply 70. The voltage drop dV is then transferred to the pin ref by the first capacitor C1 (now having dV overlapped to reference voltage as Vref−dV), and is further inputted to the positive input end (+) of the comparator 51. The comparator 51 will compares Vsh−500 mv with Vref−dV. Such comparison is equivalent to comparing 500 mV with dV since Vref equals to Vsh. If dV is higher than 500 mV, the power line resistance sensing device 10 will not allow the current flowing through the LED module 30 by keeping the LED switch 20 open-circuited.

(As shown in the timing diagram in FIG. 6, the supply voltage and the reference voltage recover gradually after the testing current dI is fired.)

Second Embodiment

Figure 7:
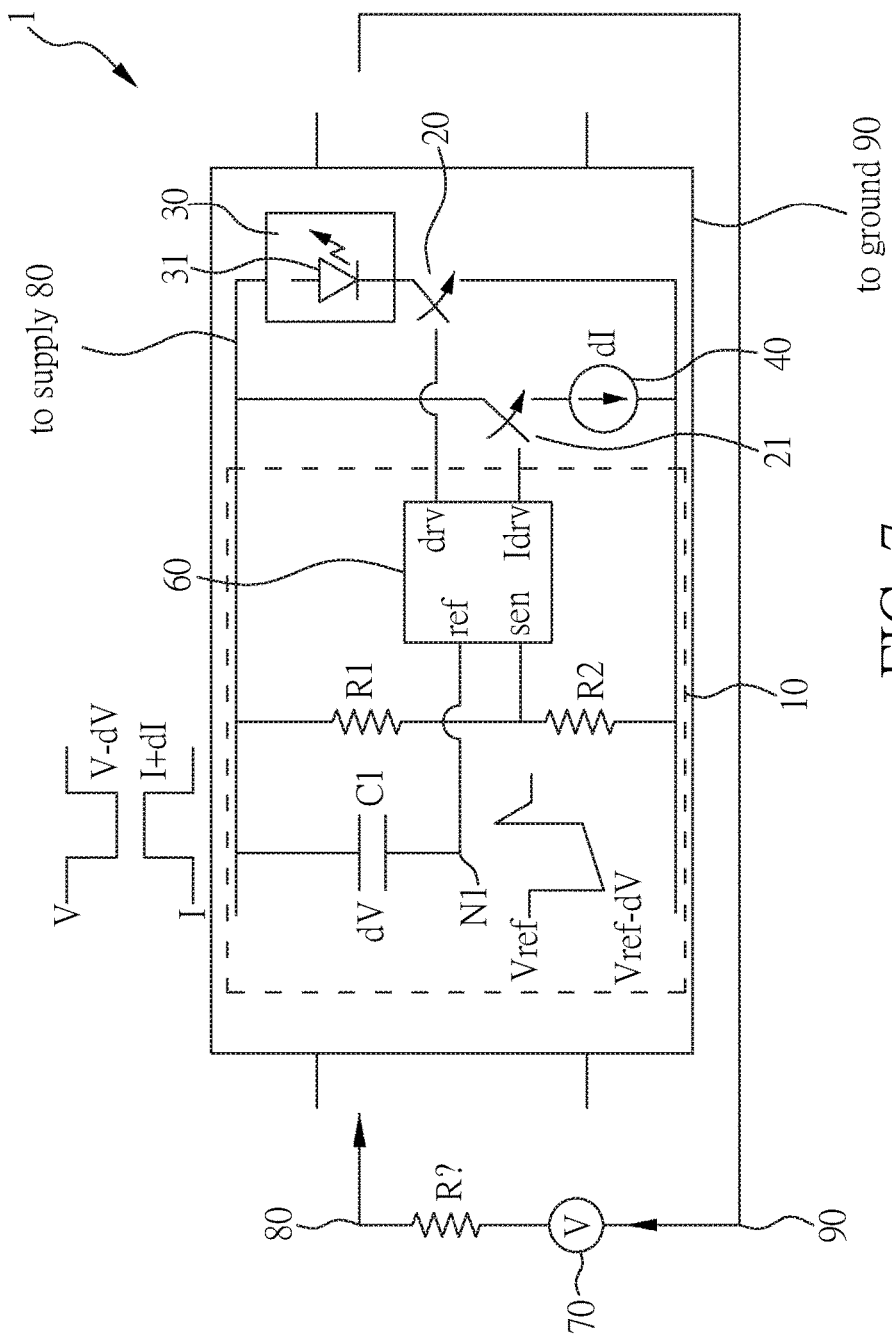
FIG. 7 shows a detailed circuit diagram of the lamp system according to another embodiment of the present invention.

FIG. 7 shows a detailed circuit diagram of the lamp system 1 according to another embodiment of the present invention.

The lamp system 1 includes a power line resistance sensing device 10, an LED switch 20, a testing switch 21, an LED module 30, a testing current source 40, and a power supply 70.

The LED module 30 is connected to the power supply 70 between power lines (a supply line 80 and a ground line 90)

through the LED switch 20. The LED module 30 includes a plurality of LEDs 31 for lighting.

The power line resistance sensing device 10 includes a control unit 60, a first resistor R1, a second resistor R2, and a first capacitor C1. The control unit 50 has four pins: dry (first pin), Idrv (second pin), ref (third pin), and sen (fourth pin). The pin dry is connected to and controls the LED switch 20 to turn on/off the LED module 30. The pin Idrv is connected to and controls the testing switch 21 to fire (inject) a testing current dI from the testing current source 40. The pin sen is used to determine a suitable timing for firing the testing current dI.

The power supply 70 may be an AC source providing a sinusoid supply voltage, which may drop to zero periodically. However, when the sinusoid supply voltage is close to zero, it is difficult to detect a voltage drop dV, V−dV may be a negative value, and thus the resistance R may be calculated incorrectly. Therefore, the power line resistance sensing device 10 is designed to detect whether the supply voltage is close to zero by comparing the supply voltage with a standard value through the pin sen, and not to fire the testing current dI if the supply voltage approaches zero.

The first capacitor C1 is arranged between the supply line 80 and the pin ref. The first capacitor C1 is used to receive the voltage drop dV when the supply voltage of the power supply 70 drops from V to V−dV. Once the testing current dI induces the voltage drop dV on the supply voltage, the voltage drop dV will also show up on the pin ref through the first capacitor C1.

For example, assuming that R1:R2=100:1, and dV=400 mV. When removing the first capacitor C1, the reference voltage may only receive a voltage component 4 mV from the voltage drop dV because R1:R2=100:1, thereby only reducing from 1.2V to 1.196V, while, if there is the first capacitor C1, the voltage drop dV may fully effect on the reference voltage, and the reference voltage will reduce from 1.2V to 0.8V.

Figure 8:
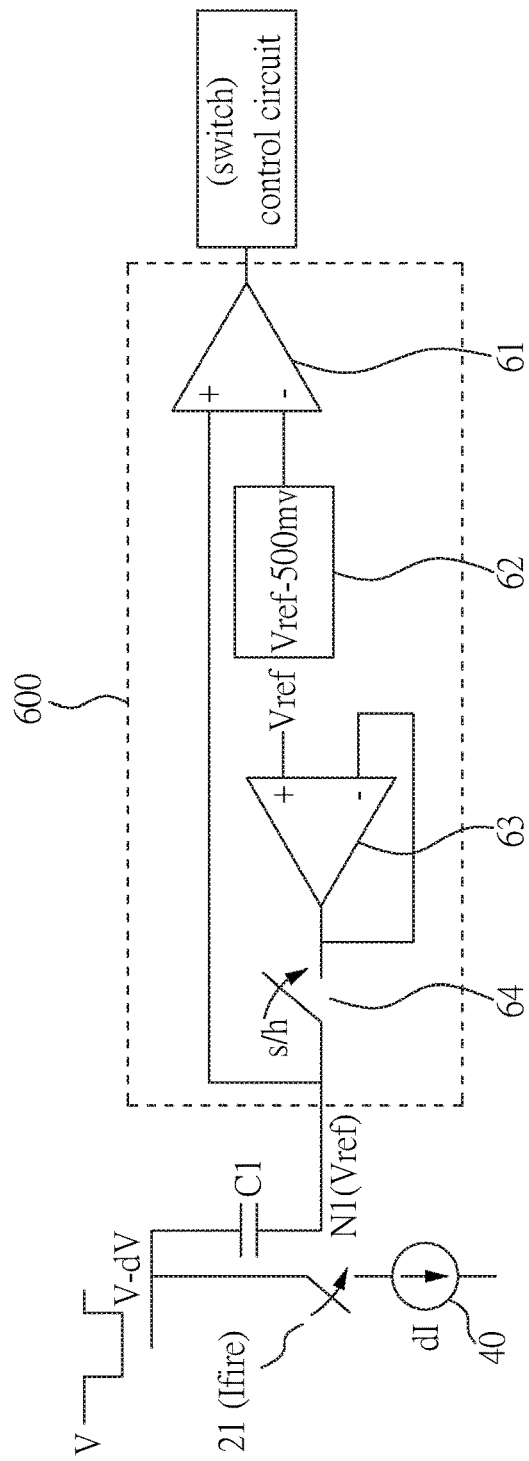
FIG. 8 shows further detailed timing diagram and circuit diagram of FIG. 7.

In this embodiment, a normal reference voltage Vref is provided by an internal buffer 63 in FIG. 8. This is a difference between the embodiments in FIG. 5 and FIG. 7.

For example, the ratio of R1:R2 may be set to be 100:1, the normal supply voltage V may be set to be 120V, and the normal reference voltage Vref may be set to be 2.5V. (It is note that Vref is set independently of R1, R2 and V.)

When the testing current dI is fired, it may induce a sharp voltage drop dV (for example, 400 mV) on the supply voltage, that is, the supply voltage will drop from 120V to 119.6V. The reference voltage of the third pin ref will drop from 2.5V to 2.1V, because 2.5V−400 mv=2.1V.

If dV≥dI×500, it means that the resistance R between the supply line 80 and the ground line 90 is higher than a normal condition, wherein the multiplier 500 is given because R>500 indicates an abnormal condition, and the multiplier may be other suitable values in different applications. In this case, the power line resistance sensing device 10 will not allow the current flowing through the LED module 30 by keeping the LED switch 20 open-circuited.

It can be appreciated that the protection of the present invention is activated before the LED module 30 becomes conductive, and thus the user can be protected effectively.

FIG. 8 shows further detailed timing diagram and circuit diagram of FIG. 7.

The control unit 60 in FIG. 6 includes a comparing circuit 600 and a (switch) control circuit (not labeled by a reference numeral). The control circuit is designed to control the LED switch 20 in FIG. 5 and the testing switch 21 based on a comparison result given by the comparing circuit 600. The control circuit may be implemented by any suitable circuit, and the detailed description is omitted here.

The comparing circuit 600 includes a comparator 61, a calculator 62, an internal buffer 63, and a sample-hold switch 64.

There is a sample-hold node N1 to which the first capacitor C1 is connected. The comparator 61 has a positive (first) input end (+) connected to the sample-hold node N1, and a negative (second) input end (−) connected to an output end of the calculator 62. The internal buffer 63 has a positive (first) input end (+), a negative (second) input end (−), and an output end. The positive input end (+) of the internal buffer 63 is connected to the normal reference voltage Vref. The negative input end (−) and the output end of the internal buffer 63 are connected to each other and further connected to one end of the sample-hold switch 64. Another end of the sample-hold switch 64 is connected to the sample-hold node N1.

In order to explain the operation of the circuit, some pre-defined values are provided here only for example but not meant to limiting. The testing current dI=1 mA. The safety resistance=500 ohm, and accordingly, the safety voltage drop=dI×500 ohm=500 mV. The sample and hold signal s/h=LOW means tristate. The testing signal Ifire=HIGH means 1 mA dI injected. The Ifire and the s/h are none-overlapped to keep noise free.

Before the testing current dI is fired (injected), the sample-hold signal s/h turns from HIGH to LOW to make the sample-hold switch 64 open-circuited and thus keeps (sample and hold) the normal reference voltage Vref into the sample-hold node N1. The calculator 62 provides a basic value Vref−500 mV, wherein 500 mV is the safety voltage drop. The basic value Vref−500 mv will be a comparison basic inputted to the negative input end of the comparator 61.

After a dead-time, the testing current dI is fired (injected), and the voltage drop dV occurs on the supply voltage of the power supply 70. The voltage drop dV is then transferred to the pin ref by the first capacitor C1 (now having dV overlapped to reference voltage as Vref−dV), and is further inputted to the positive input end (+) of the comparator 61. The comparator 61 will compares Vref−500 mv with Vref−dV. Such comparison is equivalent to comparing 500 mV with dV. If dV is higher than 500 mV, the power line resistance sensing device 10 will not allow the current flowing through the LED module 30 by keeping the LED switch 20 open-circuited.

It should be noted that the first embodiment and the second embodiment have different sample-hold mechanisms. The first embodiment samples and holds the voltage from the sample-hold node N1 to Vsh. The second embodiment samples and holds the voltage from the output end of the internal buffer 63 to the sample-hold node N1. The two embodiments have exactly opposite voltage transferring directions.

(Timing and Voltage Drop Reference Regarding dV and dI)

FIG. 9 shows a timing diagram of first type timing according to the present invention.

The present invention calculates and compares the voltage drop dV with dI×500, wherein the pre-defined resistance gauge is 500 ohm. If Vref−dV drops below Vref−dI×500, it means that the resistance R is higher than 500 ohm. The lamp system 1 is abnormal, and the LED module 30 should not be turned on. Alternatively, if Vref−dV drops above Vref−dI×500, it means that the resistance R is lower than 500 ohm. The lamp system 1 is normal, and the current from the power supply 70 may be sent to the LED module 30. Once the safety resistance gauge is changed, the safety voltage and current will be changed accordingly.

FIG. 10 shows a timing diagram of second type timing according to the present invention.

The first capacitor C1 between the supply line 80 and the pin ref can receive any variation at any high-frequency from the supply line 80 to the pin ref. Since a ballast operation frequency is high enough, the supply variation can go down to the pin ref by the first capacitor C1. Since the ballast operation is not synchronized with the present invention operation, the timing of the reference voltage changing may be off from the timing of dI firing. FIG. 10 shows the reference voltage drops earlier than dI is fired. A typical ballast operates at least 40 KHz, much higher than 50 Hz and 60 Hz, and the ballast operation frequency is close to the operation frequency of the present invention. However, typical offline voltage frequencies are either 50 Hz or 60 Hz, and 50 Hz or 60 Hz are much lower than the operation frequency of the present invention. Therefore, once a frequent timing shift is detected, it almost means that there is a ballast at the supply 70. In this case, it is not necessary for the power line resistance sensing device 10 to detect (calculate) the resistance R anymore.

In conclusion, the present invention provides a power line resistance sensing device 10 in a lamp system 1 to sense the resistance R between the power lines 80 and 90, in order to activate the protection before the LED module 30 becomes conductive, and thus the user can be protected from the electrical shock effectively.

Although the present invention has been explained in relation to its preferred embodiment, it is to be understood that many other possible modifications and variations can be made without departing from the spirit and scope of the invention as hereinafter claimed.

What is claimed is:

1. A power line resistance sensing device adapted to a lamp system with an LED module connected to a power supply between a supply line and a ground line;
   the power line resistance sensing device comprising:
   a first capacitor arranged between the supply line and the third pin;
   a control unit including:
   a first pin connected to an LED switch to turn on or turn off the LED module;
   a second pin connected to a testing switch to fire a testing current from a testing current source into the lamp system before a full conduction of the lamp system; and
   a third pin used to receive a voltage drop induced by the testing current fired in the lamp system;
   wherein the control unit is configured to compare the voltage drop with a predetermined safety voltage drop, thereby controlling the LED switch; and
   a first resistor and a second resistor connected to the third pin, wherein the first resistor and the second resistor form a voltage divider to provide a normal reference voltage.

2. The power line resistance sensing device as claimed in claim 1, wherein a reference voltage of the third pin recovers by the normal reference voltage after a resistance sensing is completed.

3. The power line resistance sensing device as claimed in claim 1, wherein the control unit further includes a comparing circuit and a control circuit; the control circuit is configured to control the LED switch and the testing switch based on a comparison result given by the comparing circuit.

4. The power line resistance sensing device as claimed in claim 3, wherein the comparing circuit includes a comparator, a calculator, a second capacitor, and sample-hold switch;
   the comparator has a first input end connected to a sample-hold node, and a second input end connected to an output end of the calculator;
   an input end of the calculator is connected to the second capacitor and one end of the sample-hold switch; another end of the sample-hold switch is connected to the sample-hold node.

5. The power line resistance sensing device as claimed in claim 4, wherein the first resistor, the second resistor, and the first capacitor are connected to the sample-hold node.

6. The power line resistance sensing device as claimed in claim 1, wherein the predetermined safety voltage drop is predetermined by the testing current multiplied by a safety resistance, and the safety resistance is less than 500 ohm for preventing an electrical shock on a human body, and has another suitable range in another application.

7. The power line resistance sensing device as claimed in claim 1, wherein the LED switch is initially open-circuited, and the power line resistance sensing device keeps the LED switch open-circuited if the voltage drop is greater than the predetermined safety voltage drop.

8. A power line resistance sensing device adapted to a lamp system with an LED module connected to a power supply between a supply line and a ground line;
   the power line resistance sensing device comprising:
   a control unit including:
   a first pin connected to an LED switch to turn on or turn off the LED module;
   a second pin connected to a testing switch to fire a testing current from a testing current source into the lamp system before a full conduction of the lamp system;
   a third pin used to receive a voltage drop induced by the testing current fired in the lamp system; and
   a fourth pin used to determine a suitable timing for firing the testing current;
   wherein the control unit is configured to compare the voltage drop with a predetermined safety voltage drop, thereby controlling the LED switch.

9. The power line resistance sensing device as claimed in claim 8, further comprising a first capacitor arranged between the supply line and the fourth pin.

10. The power line resistance sensing device as claimed in claim 9, further comprising:
    a first resistor and a second resistor connected to the third pin; and
    an internal buffer providing a normal reference voltage to the first capacitor.

11. The power line resistance sensing device as claimed in claim 10, wherein the normal reference voltage is set independent of the first resistor, the second resistor, and the power supply.

12. The power line resistance sensing device as claimed in claim 11, wherein a reference voltage of the fourth pin recovers by the internal buffer after a resistance sensing is completed.

13. The power line resistance sensing device as claimed in claim 8, wherein the control unit further includes a comparing circuit and a control circuit; the control circuit is configured to control the LED switch and the testing switch based on a comparison result given by the comparing circuit.

14. The power line resistance sensing device as claimed in claim 13, wherein the comparing circuit includes a comparator, a calculator, the internal buffer, and a sample-hold switch;

the comparator has a first input end connected to a sample-hold node, and a second input end connected to an output end of the calculator;

the internal buffer has a first input end, a second input end, and an output end, the first input end of the internal buffer is connected to a normal reference voltage, the second input end and the output end of the internal buffer are connected to each other and further connected to one end of the sample-hold switch; and another end of the sample-hold switch is connected to the sample-hold node; and the first capacitor is connected to the sample-hold node.

15. The power line resistance sensing device as claimed in claim 8, wherein the power line resistance sensing device performs a synchronization check of the voltage drop and the testing current.

16. The power line resistance sensing device as claimed in claim 8, wherein the predetermined safety voltage drop is predetermined by the testing current multiplied by a safety resistance, and the safety resistance is less than 500 ohm for preventing an electrical shock on a human body, and has another suitable range in another application.

17. The power line resistance sensing device as claimed in claim 8, wherein the LED switch is initially open-circuited, and the power line resistance sensing device keeps the LED switch open-circuited if the voltage drop is greater than the predetermined safety voltage drop.

* * * * *